(12) United States Patent
Watanabe

(10) Patent No.: US 6,916,370 B2
(45) Date of Patent: Jul. 12, 2005

(54) QUARTZ GLASS CRUCIBLE FOR PULLING UP SILICON SINGLE CRYSTAL AND METHOD FOR PRODUCING THE SAME

(75) Inventor: Hiroyuki Watanabe, Koriyama (JP)

(73) Assignees: Heraeus Quarzglas GmbH & Co. KG, Hanau (DE); Shin-Etsu Quartz Products Co. Ltd., Tokyo (JP)

( * ) Notice: Subject to any disclaimer, the term of this patent is extended or adjusted under 35 U.S.C. 154(b) by 174 days.

(21) Appl. No.: 10/345,056

(22) Filed: Jan. 15, 2003

(65) Prior Publication Data

US 2003/0159646 A1 Aug. 28, 2003

(30) Foreign Application Priority Data

Jan. 17, 2002 (JP) ....................................... 2002-009024

(51) Int. Cl.⁷ .............................................. C30B 13/02
(52) U.S. Cl. .................... 117/13; 117/208; 117/213; 117/900; 65/18.1; 65/60.8; 65/71; 65/144
(58) Field of Search ................................ 117/208, 213, 117/13; 65/18.1, 60.8, 71, 144

(56) References Cited

U.S. PATENT DOCUMENTS

| | | | |
|---|---|---|---|
| 5,174,801 A | * 12/1992 | Matsumura et al. | ......... 65/17.3 |
| 5,885,071 A | * 3/1999 | Watanabe et al. | ........... 432/264 |
| 6,280,522 B1 | 8/2001 | Watanabe et al. | |
| 6,672,107 B2 | * 1/2004 | Werdecker et al. | ......... 65/17.4 |

FOREIGN PATENT DOCUMENTS

| EP | 1 026 289 A1 | 8/2000 | |
|---|---|---|---|
| EP | 1026289 | * | 9/2000 |
| JP | 4-22861 | | 1/1992 |
| JP | 8-2932 | | 1/1996 |
| JP | 8-169798 | * | 7/1996 |
| WO | WO00/06811 | | 2/2000 |

OTHER PUBLICATIONS

Patent Abstarcts of Japan for JP 04–022861, published Jan. 27, 1992.

Patent Abstarcts of Japan for JP 08–002932, published Jan. 9, 1996.

* cited by examiner

Primary Examiner—Robert Kunemund
(74) Attorney, Agent, or Firm—Tiajoloff & Kelly

(57) ABSTRACT

An object of the invention is to provide a quartz glass crucible for pulling up silicon single crystal and a method for producing the same, suitable for improving the productivity of the crucible and the quality of the silicon single crystal, which, by forming a crystalline layer on the inner surface of the quartz glass crucible during pulling up silicon single crystal, prevents degradation from occurring on the inner surface of the crucible and increases the ratio of single crystal while preventing the dislocation from forming on the single crystals. The objects above have been accomplished by a quartz glass crucible for pulling up silicon single crystal, having a double layered structure comprising a naturally occurring quartz glass outer layer and a synthetic quartz glass inner layer, said synthetic quartz glass inner layer contains at least one type of an alkali metal ion selected from the group consisting of Na ion, K ion, and Li ion, which is diffused or moved from said naturally occurring quartz glass outer layer into said synthetic quartz glass inner layer.

4 Claims, 2 Drawing Sheets

QUARTZ GLASS CRUCIBLE FOR PULLING UP SILICON SINGLE CRYSTAL AND METHOD FOR PRODUCING THE SAME

The present invention relates to a quartz glass crucible for pulling up silicon single crystal and a method for producing the same.

So far, when a single crystal material such as a single crystal semiconductor material is produced, a method that one calls Czochralski method has been widely adopted. In this method, polycrystalline silicon is melted in a vessel to obtain a melt, and in this silicon melt a tip end of a seed crystal is immersed and pulled up while rotating it. Thereby, a single crystal having the same crystal orientation with the seed crystal grows thereon. For a vessel for use in pulling up a silicon single crystal, a quartz glass crucible is generally used.

Ordinarily, a quartz glass crucible is used over a long time while holding the silicon melt at temperatures equal to 1500 degree centigrade or more. An operating time varies depending on a crucible size and single crystal producing conditions, and in some cases exceeds 100 hr.

When it is used over such a long time, on a quartz glass surface that is brought into contact with the silicon melt, brown cristobalite appears in ring (annular) and grows as the time goes. It is known that when the time goes on further and the quartz crucible is further eroded, a rough surface appears on an inner surface, and dislocations tend to be generated in a silicon single crystal.

Taking into consideration this point, as disclosed in Japanese Patent Laid-Open No. HEI 8-2932, a method is proposed in which a crystallization accelerator containing coating or solid solution layer is formed within a thickness of 1 mm of an inner surface of a quartz glass crucible for use in pulling up silicon single crystal, and thereby the surface is inhibited from being roughened.

However, when Ba is used as a crystallization accelerator, there is a problem in that a crystal layer formed by heating is so thick that crystal fragments peel off due to deep cracks. Furthermore, when the crystallization accelerator is added to an inner surface of the quartz glass crucible, there is a concern that a substance other than a target one may be stuck thereto.

The present inventors have made a proposal (WO 00/06811) in which in order to crystallize a crucible inner surface without using an impurity during manufacture of single crystal, a hydroxy group content and nitrogen content in the quartz glass are controlled. In the proposal, there is disclosed a technology in which though the viscosity of the crucible inner surface becomes temporarily lower, after the crystallization, a stronger inner surface is formed.

However, actually, since the technology is likely to be influenced by a melting atmosphere, the physical properties are difficult to control. In particular, the melting atmosphere in a large diameter quartz glass crucible is controlled with further difficulty.

The present invention is attained by paying attention to the aforementioned problems. The present invention intends to provide a quartz glass crucible for use in pulling up silicon single crystal in which during pulling up a silicon single crystal, a crystal layer is formed on an inner surface of a quartz glass crucible, thereby the inner surface of the crucible is inhibited from deteriorating and a rate of single crystal is improved while the single crystal is suppressed from having dislocations therein, resulting in improvement in crucible productivity and silicon single crystal properties; and a method for producing the quartz glass crucible.

In order to overcome the aforementioned problems, the quartz glass crucible for use in pulling up silicon single crystal of the present invention is characterized in that in a quartz glass crucible for use in pulling up silicon single crystal having a two-layer structure made of a naturally-occurring quartz glass outer layer and a synthetic quartz glass inner layer, the synthetic quartz glass inner layer contains at least one kind of alkali metal ion of alkali metal selected from a group of Na ion, K ion, and Li ion that has diffused or moved from the naturally-occurring quartz glass outer layer into the synthetic quartz glass inner layer.

As the characteristics of the quartz glass crucible for pulling up silicon single crystal of the present invention that are not found in the existing quartz glass crucible for use in pulling up silicon single crystal, the followings can be cited. That is, firstly there is no need of a particular process for introducing an alkali metal ion into the inner layer, for instance, an operation such as spraying or coating. Secondly, since there is no need of adding the crystallization accelerator in quartz powder for use in the inner layer, the inner layer does not take in impurities other than target elements. Thirdly, since the alkali metal ions are dispersed in the inner layer, even after hydrofluoric acid washing is performed for a long time, there is no variation in the obtained effect.

It is preferable for the alkali metal ion to be at least one kind selected from a group of Na ion, K ion and Li ion, and for a sum of contents of the alkali metal ions to be in the range of from 0.01 ppm to 10 ppm, more preferable to be in the range of from 0.01 ppm to 5 ppm. When the alkali metal ion is contained too less, since a crystal layer is not formed with a sufficient thickness on the crucible inner surface, the effect of inhibiting the single crystal from having dislocations in the silicon single crystal production becomes small. On the other hand, when the alkali metal ion is contained too much, the alkali metal ion cannot be discharged outside from the melt and is taken into the silicon single crystal, resulting in adverse effects such as crystal defect and so on.

By forming in the aforementioned configuration, when the quartz glass crucible and the silicon melt are brought into contact, a crystal layer having a desired thickness can be formed on the inner surface of the quartz glass crucible. Under high temperatures, the quartz glass reacts with the silicon melt, forms SiO and is taken in the silicon melt. At this time, the quartz glass whose viscosity is lowered owing to the alkali metal ion is in a state that it is easily transformed into a crystalline state than usual. Although the thickness necessary for the crystal layer depends on a crucible size and use conditions, it is preferable to be in the range of from 0.1 $\mu$m to 10 $\mu$m or less for one hour of contact with the silicon melt. When the crystal layer is too thick, there occurs a problem of peeling of crystal fragments due to cracks. The thickness of the crystal layer can be freely controlled by adjusting an amount of the alkali metal ion that is contained in the naturally-occurring quartz powder that is used for the outer layer, a melting time and so on.

The method of the present invention is one in which by use of a rotating top-opened mold a quartz glass crucible for use in pulling up a silicon single crystal is produced. The present method includes:

(a) supplying naturally-occurring quartz powder into the mold and forming a pre-mold body along the inner surface of the mold:

(b) heating and melting the pre-mold body, and thereby forming a naturally-occurring quartz glass outer layer; and (c) during or after the formation of the naturally-occurring quartz glass outer layer, supplying synthetic quartz powder in a high temperature gas atmosphere in the naturally-occurring quartz glass outer layer, allowing sputtering toward the inner surface and fusing, and thereby forming a synthetic quartz glass layer. In the above, the present method is characterized in that an amount of alkali metal ion that diffuses or moves from the naturally-occurring quartz glass layer to the synthetic quartz glass layer is controlled to a predetermined amount.

Also in the method of the present invention, the alkali metal ion is at least one kind of ion selected from a group of Na ion, K ion and Li ion, and a sum of the contents of the alkali metal ions is preferable to be in the range of from 0.01 ppm to 10 ppm, more preferably in the range of from 0.01 ppm to 5 ppm.

In the following, one embodiment of the present invention will be explained with reference to the accompanying drawings. However, the explanations are ones that are shown as illustrations and should not be construed as restrictive ones.

Figure 1:
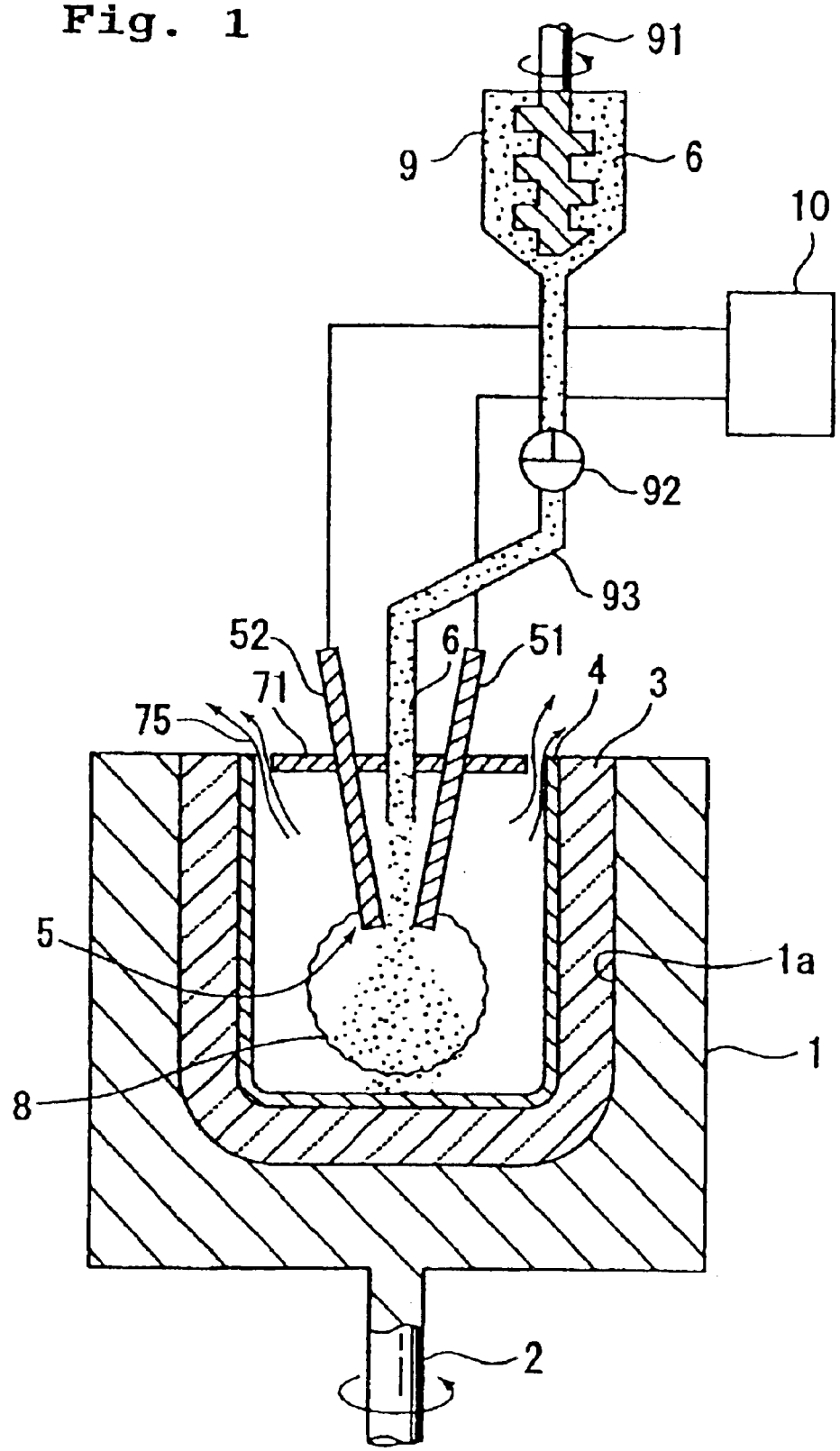
FIG. 1 is an explanatory sectional view showing apparatus that is used to implement the method of the present invention and a method for producing a quartz glass crucible therewith.

In FIG. 1, a rotating mold 1 is provided with a rotary shaft 2. In the rotating mold 1, a cavity 1a is formed, and in this mold cavity 1a translucent quartz glass made of naturally-occurring quartz powder, that is, a base body 3 of a quartz glass crucible that constitutes an outer layer is disposed.

The base body 3 is produced in the following way. That is, naturally-occurring quartz powder is threw into the mold 1 that is rotating, shaped along an inner wall of the mold 1, and thereby obtaining a pre-mold body having a substantially necessary crucible shape. After heating the pre-mold body from the inside thereof to melt the naturally-occurring quartz powder, is cooled. Thereby, the base body 3 is produced.

In order to heat from the inner surface, as shown in FIG. 1, an arc-discharge apparatus 5 that is connected to a power supply 10 and equipped with carbon electrodes 51 and 52 may be used. A plasma discharge apparatus may be used in place of the arc discharge apparatus 5. The production of the base body 3 is detailed in Japanese Patent Laid-Open No. HEI 4-22861.

The apparatus shown in FIG. 1, in order to form an inner layer 4, is provided above the mold 1 with a supply tank 9 for reserving synthetic silica powder 6. A discharge pipe 93 equipped with a measuring feeder 92 is connected to the supply tank 9. A stirring blade 91 is disposed in the supply tank 9. A top portion of the mold 1 is covered with a lid 71 except for a slit aperture 75.

After the base body 3 is formed, or during the formation of the base body 3, while continually heating due to discharge from the carbon electrodes 51 and 52 of the arc discharge apparatus 5, the measuring feeder 92 for feeding the synthetic quartz powder 6 is opened to an adjusted opening and the synthetic quartz powder is fed from the discharge pipe 93 inside of the base body 3. When the arc discharge apparatus 5 is operated, a high temperature gas atmosphere 8 is formed in the base body 3. Accordingly, the synthetic quartz powder is fed into this high temperature gas atmosphere 8.

The high temperature gas atmosphere denotes an atmosphere formed in the surroundings of the carbon electrodes 51 and 52 owing to the arc discharge therewith, and is heated to a temperature sufficient to melt the quartz glass or more, specifically to a high temperature of two thousands and several hundreds degree centigrade.

The synthetic quartz powder fed into the high temperature gas atmosphere 8 is at least partially melted owing to heat in the high temperature gas atmosphere 8, at the same time sputtered toward the inner surface of the base body 3, stuck to the inner surface of the base body 3, and thereby forms, in integrally fusing with the base body 3 on the inner surface of the base body 3, a substantially bubble-free quartz glass layer, that is, the inner layer 4. The method for forming this inner layer 4 is detailed in the aforementioned Japanese Patent Laid-Open No. HEI 4-22861.

Figure 2:
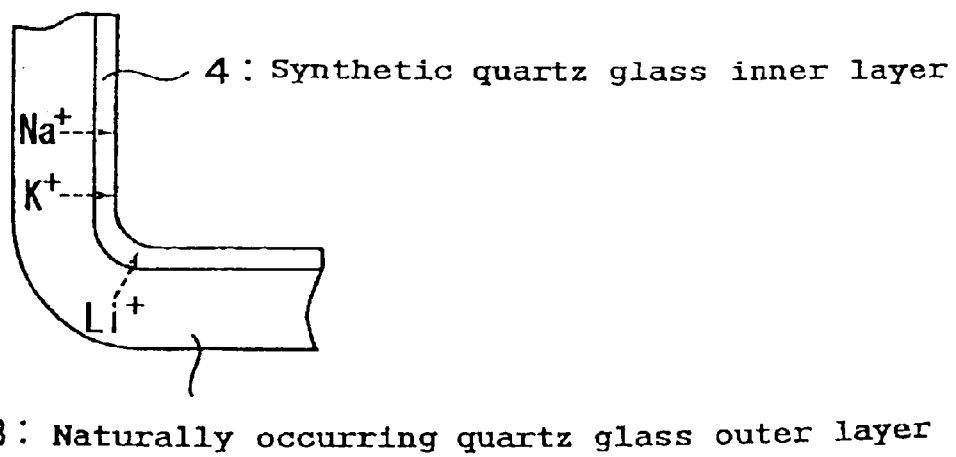
FIG. 2 is a partial sectional view of the quartz glass crucible for pulling up a silicon single crystal of the present invention.

In FIG. 2, a sectional view of a quartz glass crucible obtained according to the present method is shown. The quartz glass crucible according to the present invention includes an outer layer, that is, a base body 3, formed by heating naturally-occurring quartz powder from the inner surface and melting, and an inner layer 4 that is formed by discharging the synthetic quartz powder into the high temperature gas atmosphere, melting and sputtering, and sticking to the inner surface of the base body 3.

The quartz glass crucible of the present invention is characterized in that the inner layer 4 contains at least one kind of alkali metal ion selected from a group of Na ion, K ion and Li ion that have diffused or moved from the outer layer (base body) 3 to the inner layer 4. A sum of the contents of the alkali metal ions in the inner layer 4 is preferable to be in the range of 0.01 ppm to 10 ppm, more preferable to be in the range of 0.01 ppm to 5 ppm.

By constituting thus, when the inner surface of the quartz glass crucible is brought into contact with the silicon melt, a thickness of an inner surface crystal layer can be allowed to form in the range of, for instance, 0.1 $\mu$m to 10 $\mu$m for one contact hour.

In the following, the present invention will be explained with embodiments.

By the use of an apparatus shown in FIG. 1, a quartz glass crucible having an outer diameter of 22 inch is produced. At the production thereof, 20 kg of naturally-occurring quartz powder that is adjusted in advance so as to contain 3.1 ppm of Na, 2.8 ppm of K and 3.2 ppm of Li is fed into a rotating top-opened mold and is molded, and thereby a pre-mold body destined to be an outer layer is prepared.

The molded body is heated and melted from the inner surface thereof and the outer layer is formed, and 3 kg of high purity synthetic quartz powder containing Na less than 0.01 ppm, K less than 0.01 ppm and Li less than 0.01 ppm is fed into a high temperature gas atmosphere formed inside of the outer layer and sputtered to an inner surface of the pre-mold body followed by melting, and thereby a quartz glass crucible having an outer diameter of 22 inch is produced.

When contents of metal elements in the synthetic quartz powder that is used here are measured, it was found that the respective contents are less than 0.5 ppm for each of Al and Ti, 0.1 ppm for each of Fe and Ca, less than 0.1 ppm for each of Na, K, Li and Mg, 10 ppb for Zn, 5 ppb for each of Ni and Cr, 3 ppb for Ba, 1 ppb for each of Cu and Pb, and less than 1 ppb for each of other elements (Mn, Co, Ga, Sr, Y, Zr, Nb, Ag, Sn, Sb, Hf, Ta, U and Th).

When the inner layer made of the synthetic quartz glass in the produced crucible is subjected to a chemical analysis, it was found that Na is contained by 1.6 ppm, K is contained by 1.4 ppm and Li is contained by 1.8 ppm. Inside of the inner surface of this sample, raw material silicon is put, and heated in an electric furnace at a temperature of 1500 degree centigrade for 10 hr. After cooling to room temperature, a portion that is brought into contact with the silicon melt is evaluated by microscopy and X-ray diffractometry, and it was found that there is formed a crystal layer of substantially 70 μm.

Except for each of the alkali metals Na, K and Li being contained by less than 0.01 ppm in naturally-occurring quartz powder used for the outer layer, in the similar way to that of embodiment 1, a quartz glass crucible having an outer diameter of 22 inch is produced. When an inner layer made of synthetic quartz glass in the produced crucible is chemically analyzed, neither one of Na, K and Li is detected. Inside of the inner surface of this sample, raw material silicon is put and heated in an electric furnace at a temperature of 1500 degree centigrade for 10 hr. After cooling to room temperature, a section of a portion that is brought into contact with the silicon melt is observed by microscopy and the inner layer is evaluated by X-ray diffractometry, and it is observed that there is formed a crystal layer of substantially 0.8 μm.

As mentioned above, according to the quartz glass crucible of the present invention, a crystal layer can be formed on an inner surface of the quartz crucible in the course of pulling up a silicon single crystal, thereby the inner surface of the crucible can be inhibited from deteriorating and a rate of single crystal is improved while the single crystal is inhibited from having dislocations therein, resulting in an improvement in crucible productivity and quality of the silicon single crystal.

Furthermore, according to the present method, simultaneously with the completion of the melting of the quartz glass crucible, the diffusion and movement of the alkali metal ions are also in completion, accordingly the quartz glass crucible of the present invention can be produced with extremely high productivity.

FIG. 1 is an explanatory diagram showing schematically drawn cross section view of the apparatus for use in practicing the method according to the present invention and the method for producing quartz glass crucible using said apparatus.

FIG. 2 is an explanatory diagram showing partial cross section view of a quartz glass crucible for pulling up the silicon single crystal according to the present invention.

Explanation of the Symbols:

1: Mold, 1a: Cavity, 2: Rotary shaft, 3: Outer layer, 4: Inner layer, 5: Arc discharge apparatus, 6: Powder of synthetic quartz, 8: High temperature gaseous atmosphere, 9: Supply tank, 10: Power source, 51, 52: Carbon electrodes, 71: Lid, 75: Slit aperture, 91: Stirring blade, 92: Measuring feeder, 93: Outlet pipe.

What is claimed is:

1. A quartz glass crucible for pulling up silicon single crystal, said quartz glass crucible comprising a double layered structure comprising a naturally occurring quartz glass outer layer and a synthetic quartz glass inner layer, wherein said synthetic quartz glass inner layer contains at least one type of an alkali metal ion selected from the group consisting of Na ion, K ion, and Li ion diffused or moved from said naturally occurring quartz glass outer layer into said synthetic quartz glass inner layer, and wherein the quartz glass crucible has an inner surface, and, when the inner surface of said quartz glass crucible is brought into contact with a silicon melt, a crystalline layer in the inner surface is formed in the range of from 0.1 μm to 10 μm of thickness per hour of contact.

2. A quartz glass crucible as claimed in claim 1, wherein said synthetic quartz glass inner layer contains said alkali metal ions in an amount of from 0.01 ppm to 10 ppm in total.

3. A method for producing a quartz glass crucible for pulling up silicon single crystal using a rotating mold having an inside and an upper aperture communicating therewith, said method comprising:

(a) a step of supplying a powder of naturally occurring quartz to the inside of said mold to form a pre-molded body along an inner wall surface of said mold;

(b) a step of forming a naturally occurring quartz glass outer layer by heating and melting (c) a step of supplying, either during or after forming the naturally occurring quartz glass outer layer, a powder of synthetic quartz inside a high temperature gaseous atmosphere inside the naturally occurring quartz glass outer layer, and then allowing the powder to fly and melt adhere to the inner wall surface so as to form a synthetic quartz glass inner layer and to control the amount of alkali metal ions that diffuse or move from said naturally occurring quartz glass outer layer into said synthetic quartz glass inner layer; and wherein the resulting quartz glass crucible has an inner surface, and, when the inner surface of said quartz glass crucible is brought into contact with a silicon melt, a crystalline layer in the inner surface is formed in the range of from 0.1 μm to 10 μm of thickness per hour of contact.

4. A method for producing a quartz glass crucible for pulling up silicon single crystal as claimed in claim 3, wherein said alkali metal ion is at least one ion selected from the group consisting of Na ion, K ion, and Li ion.

* * * * *